United States Patent
Tansley (10) Patent No.: US 10,238,007 B2
(45) Date of Patent: Mar. 19, 2019

(54) COOLING APPARATUS AND METHOD

(71) Applicant: The Sure Chill Company Limited, Tywyn (GB)

(72) Inventor: Ian Tansley, Tywyn (GB)

(73) Assignee: THE SURE CHILL COMPANY LIMITED, Cardiff (GB)

( * ) Notice: Subject to any disclaimer, the term of this patent is extended or adjusted under 35 U.S.C. 154(b) by 749 days.

(21) Appl. No.: 14/767,903

(22) PCT Filed: Jan. 17, 2014

(86) PCT No.: PCT/GB2014/050145
§ 371 (c)(1),
(2) Date: Aug. 13, 2015

(87) PCT Pub. No.: WO2014/111730
PCT Pub. Date: Jul. 24, 2014

(65) Prior Publication Data
US 2016/0029515 A1    Jan. 28, 2016

(30) Foreign Application Priority Data

Jan. 17, 2013 (GB) .................................. 1300885.9

(51) Int. Cl.
*H05K 7/20* (2006.01)
*F25D 3/02* (2006.01)
(Continued)

(52) U.S. Cl.
CPC ........... *H05K 7/20272* (2013.01); *F25D 3/02* (2013.01); *F25D 11/006* (2013.01); *F25D 17/02* (2013.01); *F25B 27/00* (2013.01)

(58) Field of Classification Search
CPC ... H01L 23/467; H01L 23/44; H05K 7/20272; F25D 13/065; F25D 3/02; F25D 11/006; F25D 17/02
See application file for complete search history.

(56) References Cited

U.S. PATENT DOCUMENTS

| 1,988,549 A | 1/1935 | Gibson |
| 6,549,408 B2 * | 4/2003 | Berchowitz ......... F28D 15/0266 165/80.4 |

(Continued)

FOREIGN PATENT DOCUMENTS

| CN | 101002062 A | 7/2007 |
| DE | 102011052722 B3 * | 8/2012 ........... H01L 23/473 |

(Continued)

OTHER PUBLICATIONS

International Search Report dated Mar. 4, 2014, for International Patent Application No. PCT/GB2014/050145 filed Jan. 14, 2014; 3 pages.

(Continued)

*Primary Examiner* — Tho V Duong
(74) *Attorney, Agent, or Firm* — Perkins Coie LLP (57) ABSTRACT

Some embodiments of the present invention provide apparatus for cooling an article. The apparatus comprises a heat exchanger arranged to be fed with fluid from a fluid reservoir disposed, in use, above the heat exchanger. The fluid reservoir includes cooling means for cooling fluid in the reservoir such that the fluid flows under gravity into the heat exchanger so as to cool an article. The apparatus may be arranged to cool one or more batteries or other articles, for example in a telecommunications base station.

29 Claims, 3 Drawing Sheets

(51) Int. Cl.
  *F25D 11/00* (2006.01)
  *F25D 17/02* (2006.01)
  *F25B 27/00* (2006.01)

(56) References Cited

U.S. PATENT DOCUMENTS

| | | | |
|---|---|---|---|
| 2008/0092559 A1* | 4/2008 | Williams | B60P 3/20 62/59 |
| 2008/0199305 A1* | 8/2008 | Wu | F04D 29/582 415/121.3 |
| 2011/0127027 A1* | 6/2011 | Kashirajima | F24F 3/065 165/286 |
| 2012/0102994 A1 | 5/2012 | Tansley | |

FOREIGN PATENT DOCUMENTS

| | | |
|---|---|---|
| GB | 165684 A | 7/1921 |
| GB | 2471865 A | 1/2011 |
| GB | 2498777 A | 7/2013 |
| JP | 2004264006 A | 9/2004 |
| SU | 898226 A1 | 1/1982 |
| WO | WO 2011007162 A3 * | 5/2011 ............ F25D 11/003 |

OTHER PUBLICATIONS

International Preliminary Report on Patentability and Written Opinion dated Jul. 21, 2015, for International Patent Application No. PCT/GB2014/050145 filed Jan. 14, 2014; 7 pages.
Office Action dated Feb. 21, 2017 for Eurasian Patent Application No. 201591346/31 filed Jan. 17, 2014; 4 pages.
Combined Search and Examination Report for United Kingdom Application No. GB1400844.5; dated Jul. 9, 2014; 7 pages.
Examination Report for United Kingdom Application No. GB1400844.5; dated Jul. 23, 2015; 3 pages.
Examination Report for United Kingdom Application No. GB1400844.5; dated Apr. 4, 2016; 2 pages.
First Office Action for Chinese Patent Application No. 201480016578.4; dated Sep. 26, 2016; 16 pages.

* cited by examiner

COOLING APPARATUS AND METHOD

PRIORITY CLAIM

This application is the U.S. National Phase Patent Application of PCT International Patent Application No. PCT/GB2014/050145, entitled "COOLING APPARATUS AND METHOD" and filed on Jan. 17, 2014, which claims priority to U.K. Patent Application No. 20130000885 entitled "COOLING APPARATUS AND METHOD" and filed on Jan. 17, 2013. The contents of the above-identified applications are incorporated herein by reference in their entirety.

FIELD OF THE INVENTION

The present invention relates to a cooling apparatus and particularly, but not exclusively, to a apparatus for cooling a battery or battery pack used to supply back-up electric power to an electrical system. Aspects of the invention relate to an apparatus, to a battery or battery pack and to a method.

BACKGROUND

A large proportion of the world's population do not have access to a consistent and reliable supply of mains electricity. In some countries, particularly underdeveloped countries, the supply of electricity is rationed by means of "load shedding", the creation of intentional power outages known as "rolling blackouts". In many African, South Asian and Latin American countries, for example, rolling blackouts are a common occurrence and while they are often scheduled at fixed times of the day and week, allowing people to work around the known interruption times, they frequently occur unexpectedly and without warning.

Even in developed countries, the demand for electricity occasionally exceeds the power supply capability of the network, thereby requiring localised or widespread load shedding. In addition, failure of the mains electricity supply can occur due to unforeseen events such as natural disasters or terrorist attacks.

The operation of electrical equipment intended for permanent operation in areas subject to unreliable electricity supply can therefore be difficult. The loss of electrical power to lighting systems, telecommunications systems or refrigeration systems which, in underdeveloped countries, are frequently used to store medicines such as vaccines requiring storage within a strict limited range of temperatures, can be disastrous.

The problem is often mitigated to some degree by the provision of back-up batteries, for example lead acid batteries, to supply electricity to the electrical equipment in the event of a mains supply failure. In a typical telecommunications application, a plurality of 2V batteries or battery cells are provided in series to form a battery or battery pack developing a combined output voltage of 24V, 48V or 96V, depending on power requirements.

The performance of such batteries, and in particular their useable lifetime, is dependent to a great extent on their temperature. The Arrhenius equation defines the relationship between temperature and the rate at which a chemical reaction, for example the reaction within a battery, proceeds. It shows that the reaction rate increases exponentially as temperature rises. Since the lifetime of the battery is inversely proportional to the reaction rate, it follows that the lifetime of the battery decays exponentially with temperature rise.

In general, the reaction rate doubles (and thus the lifetime halves) for every 10° C. increase in battery temperature. Thus, a battery operating at 35° C. will have a useful lifetime around half that of a battery operating at 25° C. and around one quarter that of a battery whose temperature is maintained at 15° C.

Apart from the gradual deterioration of the battery over time, temperature effects can occasionally lead to premature failure of the cell. This can happen even under normal operating conditions if the rate of heat generated in the battery exceeds the rate of heat loss to the environment. In this situation the battery temperature will continue to rise leading to a condition known as "thermal runaway" which can have serious physical as well as operational consequences.

It is unfortunate that those regions of the world which are subject to unreliable mains electrical power and thus require battery back up for essential electrical systems are often those in which ambient temperatures are continuously high and in which the usable life of such batteries is therefore reduced. Battery cooling systems, such as air conditioning equipment, reduce the effect of high ambient temperatures on battery life. However, such devices usually require electrical power themselves and thus are uneconomical where mains power is not readily available.

It is against this background that the present invention has been conceived. The applicants have recognised that there is a need for an apparatus and/or method for reliably cooling batteries without requiring a constant source of electrical power.

The present applicants have previously proposed a novel form of refrigeration apparatus adapted to cool items without requiring a continuous power supply. This apparatus, which is the subject of co-pending patent application no. PCT/GB2010/051129, permits a refrigerated storage space to be maintained within a temperature range of 4-8° C. for up to 30 days following a loss of electrical power.

The applicants have recognised that the technical principles employed in this apparatus may be adapted for use in an apparatus or method for cooling batteries. Embodiments of the invention may therefore provide an apparatus or a method for cooling one or more batteries for extended periods of time without a continuous external supply of electrical power. Other aims and advantages of the invention will become apparent from the following description, claims and drawings.

STATEMENT OF INVENTION

Aspects of the invention therefore provide an apparatus, a battery or battery pack and a method as claimed in the appended claims.

According to another aspect of the invention for which protection is sought, there is provided an apparatus for cooling at least one article, optionally a battery, comprising a heat exchanger arranged to be fed with fluid from a fluid reservoir disposed, in use, above the heat exchanger, the fluid reservoir including a cooling element for cooling fluid in the reservoir such that the fluid sinks under gravity into the heat exchanger.

The apparatus may be arranged to cool a battery.

Conveniently, the fluid is water which exhibits positive thermal expansion (i.e. its volume increases as temperature increases) above approximately 4° C. and negative thermal expansion (i.e. its volume increases as temperature decreases) below approximately 4° C. Thus, water at this temperature is at its most dense and tends to sink to the bottom of any contained volume. The apparatus is therefore arranged such that, in use, the temperature of the heat exchanger, located at the bottom of the apparatus, tends to, or is maintained at, approximately 4° C. so as to cool the at least one battery.

In an embodiment, the apparatus comprises air flow means for passing air over or through the heat exchanger towards, onto or around the battery. The air flow means may comprise a fan or compressor in fluid communication with the heat exchanger. A ducting may be provided between the fan or compressor and the heat exchanger.

In an embodiment, the heat exchanger is disposed within a housing in fluid communication with the ducting, the housing comprising one or more apertures therein through which air passing over or through the heat exchanger is expelled from the housing towards, onto or around the battery. In an embodiment, the housing comprises a plurality of small diameter apertures.

In an embodiment, the heat exchanger comprises a thin-walled container having at least one heat exchange surface. The heat exchange surface may comprise a plurality of apertures arranged to permit air to pass through the heat exchanger. The heat exchanger may be formed from a thermally transmissive material, such as a metal.

In an embodiment, the or each cooling element is supplied with electrical power by one of a mains power supply, a solar power supply such as a photovoltaic cell, and a battery, for example the battery being cooled.

In an embodiment, the apparatus is arranged to provide a cooling effect on the or each battery for a minimum period of time following interruption of the power supply to the at least one cooling element.

In an embodiment, the reservoir is thermally insulated. The apparatus may be arranged such that, in use, the temperature of the fluid within the reservoir is at a temperature below a target temperature of the fluid within the heat exchanger.

According to a further aspect of the invention for which protection is sought, there is provided a battery or battery pack comprising an apparatus according to any of the preceding paragraphs.

According to a still further aspect of the invention for which protection is sought, there is provided a method for cooling a battery comprising cooling fluid stored in a reservoir disposed above a heat exchanger located in close proximity to the battery and permitting higher density fluid to sink from the reservoir into the heat exchanger so as to cool the heat exchanger and absorb heat from the battery.

The method may comprise transferring heat from fluid in the heat exchanger to fluid in the reservoir so as to maintain the temperature of the heat exchanger at or around a target temperature. In an embodiment, the target temperature is approximately 4° C. In an embodiment, the fluid is water.

The method may comprise flowing air across or through the heat exchanger such that heat is absorbed therefrom and directing said cooled air towards, onto or around the battery.

The method may comprise thermally insulating the reservoir.

According to a yet another aspect of the invention for which protection is sought, there is provided a method for cooling a battery comprising cooling fluid stored in a reservoir disposed above a heat exchanger located in close proximity to the battery, permitting higher density fluid to sink from the reservoir into the heat exchanger so as to cool the heat exchanger and absorb heat from the battery and permitting the temperature of the fluid in the reservoir to rise without a corresponding rise in temperature of the fluid in the heat exchanger so as to maintain the temperature of the battery within a target temperature range.

According to an aspect of the invention for which protection is sought, there is provided a method for cooling an article comprising: cooling fluid stored in a reservoir disposed above a heat exchanger; and permitting higher density fluid to sink from the reservoir into the heat exchanger so as to cool the heat exchanger and absorb heat from the article.

In one aspect of the invention for which protection is sought there is provided an apparatus for cooling a battery comprises a heat exchanger arranged to be fed with fluid from a fluid reservoir disposed, in use, above the heat exchanger. The fluid reservoir includes at least one cooling element for cooling fluid in the reservoir such that it flows under gravity into the heat exchanger so as to cool the battery. A fan or compressor may be provided for passing air over or through the heat exchanger towards, onto or around the battery.

Within the scope of this application it is envisaged that the various aspects, embodiments, examples, features and alternatives set out in the preceding paragraphs, in the claims and/or in the following description and drawings may be taken independently or in any combination thereof.

DETAILED DESCRIPTION OF EMBODIMENTS

The present invention will now be described, by way of example only, with reference to the accompanying drawings, in which.

Figure 1:
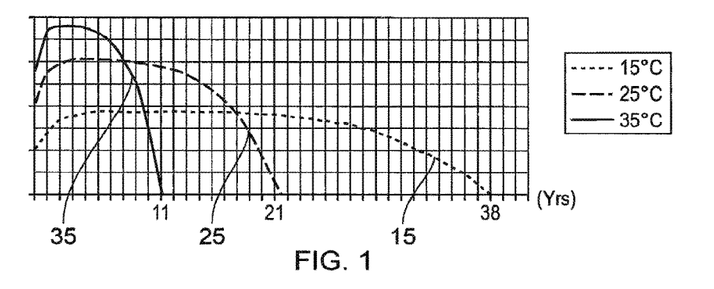
FIG. 1 is a graph illustrating how the useable life of a battery varies with temperature.

Referring firstly to the graph of FIG. 1, this illustrates the variance of battery life (abscissa) with temperature. According to the Arrhenius equation, battery life generally decays exponentially with temperature increase and a general rule of thumb is that the lifetime of the battery reduces by 50% for each 10° C. increase in battery temperature.

It can thus be seen from FIG. 1 that the lifetime of a battery operating at a temperature of 35° C. (line 35) is approximately half that of a battery operating at a temperature of 25° C. (line 25) and approximately 25% that of a battery operating at a temperature of 15° C. (line 15).

It will be understood that battery operating temperature is dependent on both ambient temperature and current draw from the battery which also has a heating effect on the battery, and thus the temperature of an operating battery in an ambient temperature of 15° C. may be similar to, or even higher than, that of a quiescent battery in an ambient temperature of 35° C. Thus, the operation of batteries for extended periods in high ambient temperatures can reduce the lifetime of the batteries by over 75%, requiring regular replacement. However, the cost and logistics of replacing batteries may be prohibitive in underdeveloped countries or geographically remote areas.

Figures 2, 3:
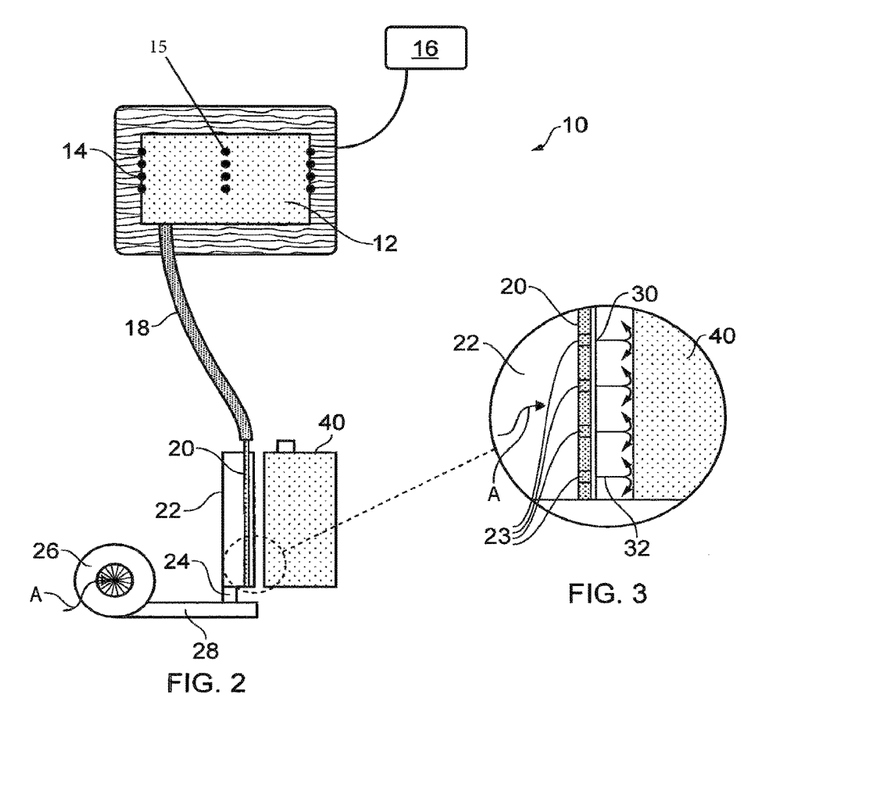
FIG. 2 is a schematic illustration of an apparatus embodying one form of the invention.
FIG. 3 is an expanded view of a section of a heat exchanger being a part of the apparatus of FIG. 2.

Referring next to FIG. 2, an apparatus embodying one form of the invention is shown, in schematic form, generally at 10. The apparatus 10 is intended for cooling one or more batteries. In the illustrated embodiment, the apparatus is arranged to cool a single battery 40. Herein, the term "battery" is used to encompass either a single battery or cell, or a plurality of cells collectively forming a battery. Some embodiments of the invention may be used to cool each of a plurality of cells, or a single battery comprising such a plurality. The battery may be of similar size to a conventional vehicle battery, for example from around 200-500 mm in length, 100-200 mm in width and 150-250 mm in height. The apparatus 10 may be arranged to cool a battery or other article of any suitable size, not limited to this size range.

The apparatus 10 comprises a thermal store in the form of a lagged (i.e. thermally insulated) fluid reservoir 12 containing a volume of fluid. In the illustrated embodiment, the fluid is mostly water. The reservoir 12 is preferably not completely filled with water so as to permit expansion of the water volume due to temperature changes during use.

An electrically-powered cooling element 14, similar to that found in a conventional refrigerator or freezer apparatus, is provided inside the reservoir 12, or at least in thermal communication with the fluid therein. Electrical power to the cooling element 14 may be supplied from a power supply 16 such as a mains power outlet or, alternatively, a solar panel or other photovoltaic supply. Advantageously, in some embodiments it is not essential that the cooling element 14 be continuously powered—indeed, one of the primary purposes of some embodiments of the present invention is to enable continued cooling of the battery in the absence of an electrical power supply to the cooling element 14. The cooling apparatus may include one or more sensors 15 disposed within the reservoir and configured to detect the formation of frozen fluid in the reservoir and interrupt the operation of the cooling means upon detection of the formation of frozen fluid.

A fluid conduit or pipe 18 connects a lower region of the reservoir 12 to an inlet of a heat exchanger 20 such that the heat exchanger 20 and the reservoir 12 are in fluid communication. That is to say, the reservoir 12 and the heat exchanger 20 form a single, contiguous fluid chamber. In the embodiment of FIG. 2 the conduit 18 is in fluid communication with the reservoir 12 via an aperture provided in a base or bottom of the reservoir 12.

The heat exchanger 20 comprises a thin-walled, cuboidal container having a relatively high surface-to-volume ratio. In the illustrated embodiment, the heat exchanger 20 is rectangular in shape having a height and width that is significantly greater than its depth. Conveniently, though not essentially, the heat exchanger 20 generally corresponds in size and surface area to the shape of the battery 40 to be cooled.

Nevertheless, the heat exchanger 20 may take substantially any shape according to the desired application, although high surface-to-volume ratio arrangements may optimise heat transfer between the fluid therein and the battery. The heat exchanger 20 is conveniently formed from a material having a high thermal conductivity or transmissivity such as a metal material, again to improve heat transfer. The heat exchanger 20 is perforated, having apertures or conduits 23 extending therethrough from one radiating surface to the other, the purpose of which is described below.

The heat exchanger 20 is disposed in a housing 22 such that it is positioned, in a generally upright orientation, close to or adjacent the battery to be cooled. The housing has an air inlet 24 in fluid communication with a fan or compressor 26 via a ducting 28. The fan or compressor 26 is arranged to draw in ambient air and pump it into the housing 22 via the ducting 28 and the inlet 24.

As shown in FIG. 3, the housing 22 features a plurality of apertures 30 in the wall thereof facing the battery 40. Air drawn into the ducting 28 by the fan or compressor 26 thus flows into the housing 22 via the inlet 24, passes through heat exchange conduits 23 that extend through the heat exchanger 20, and is expelled through the apertures 30 towards the battery 40. In the embodiment shown the heat exchange conduits are around 5-10 mm in diameter. In passing through the housing 22, some of the air flows around the heat exchanger 20 whilst a majority of the air flows through the conduits 23 formed therein. The housing apertures 30 are relatively small in size such that the air expelled therethrough takes the form of a plurality of fine air jets which are directed at the external surface of the battery 40. In some embodiments the apertures may have a diameter of from around 0.5 mm to 2 mm, optionally up to around 5 mm. The apertures may be of smaller diameter than the exchange conduits in order to increase a residence time of gas within the conduits 23, allowing a further reduction in temperature of gas passing through the conduits 23. Other sizes are also useful. In some embodiments the apertures 30 are of substantially the same diameter as the conduits 23, and substantially aligned with the apertures 30 so as not to impede air flow. In some embodiments, the housing 22 may be substantially open on the side facing the battery 40 such that air flows from the conduits 23 directly to the battery 40 and apertures 30 are not required.

The cooling function of the apparatus 10 relies upon one of the well-known anomalous properties of water: namely, that its density reaches a maximum at approximately 4° C. and thus that water at 4° C. will generally sink relative to water at higher or lower temperatures. This means that a volume of water that is cooled close to its top will form a temperature gradient, whereby the water towards the bottom of the volume will approach 4° C. The temperature at the bottom of the volume will not fall below 4° C. unless the greater part of the water in the volume becomes frozen.

Operation of the apparatus of FIG. 2 will now be described.

In order to cool the battery 40, the water in the reservoir 12 is cooled by means of the cooling element 14 using electrical power from the external power supply 16. During this time, the electrical apparatus to which the battery 40 is connected may also be powered by the external power supply 16 such that the battery 40 is quiescent and thus its temperature is at or around ambient temperature.

Before the cooling element 14 is activated, it is assumed that all of the water contained within the reservoir 12 and the heat exchanger 20 is at or around ambient temperature. As the cooling element 14 is located within or close to the reservoir 12, the water contained therein cools relatively quickly. As the temperature of the water in the reservoir 12 decreases, its density increases relative to the ambient temperature water contained in the heat exchanger 20 and thus tends to sink under gravity into the heat exchanger 20 below, displacing the water therein.

It is to be understood that a convection current may be established within the fluid volume defined by the reservoir 12 and heat exchanger 20 whereby the cooled water sinks from the reservoir 12 through the fluid conduit 18 into the heat exchanger 20 so displacing the warmer (and thus less dense) water below. This warmer water rises into the reservoir 12 through the conduit 18 and is, in turn, cooled by the cooling element 14 such that the average temperature of all of the water within the apparatus 10 falls. Eventually, the rate of convection decreases, causing the water within the heat exchanger 20 to become comparatively stagnant at a temperature below that which would otherwise be achieved if the heat exchanger 20 were not in fluid communication with the fluid in the reservoir 12. If the thermal transfer from the heat exchanger 20 to the reservoir 12 is sufficiently rapid, water in the heat exchanger may become established at a temperature of around 4° C.

Because the density of water is at its maximum at 4° C., subsequent fluctuations in the temperature of the water in the reservoir 12 tend not to cause the convection current to be re-established since water at temperatures either side of 4° C. will tend to rise to the top of the reservoir 12.

For example, even if the water in the reservoir 12, in close proximity to the cooling elements 14 falls below 4° C., or even begins to freeze, its density will remain less than that of the water contained in the heat exchanger 20, causing it to remain in the reservoir 12. Similarly, a rise in temperature of the water in the reservoir 12 above 4° C. will decrease its density causing it, too, to remain in the reservoir 12.

Consequently, in some embodiments any heat transfer from the water in the reservoir 12 to the water in the heat exchanger 20 is generally effected by means of conduction rather than convection. Since water is not a particularly efficient conductor of heat, relatively minor temperature fluctuations in the water contained in the reservoir 12 are generally not transmitted to the water in the heat exchanger 20.

It can therefore be seen that the temperature of the water in the heat exchanger 20 may remain at approximately 4° C. substantially irrespective of temperature fluctuations in the water contained in the reservoir 12.

The fan or compressor 26, powered by the external power supply 16, draws in ambient air and forces it, via the ducting 28, through the inlet 24 and into the housing 22. The air in the housing 22 flows around, or through the apertures formed in the heat exchanger 20 whereby it is cooled due to heat absorption by the water contained therein. The cooled air is then expelled through the apertures 30 in the front wall of the housing 22 in an array of fine air jets directed towards the surface of the battery 40.

Heat from the battery 40 is absorbed by the cooled air thereby lowering the temperature of the battery 40. Hence, a battery 40 subject to high ambient temperatures can be simply and efficiently cooled, allowing it to be maintained at a lower temperature and mitigating the adverse effects of high ambient temperatures on battery life.

It will be understood that heat absorbed from the flow of ambient air across the heat exchanger 20 raises the temperature of the water therein. The heat absorbed by the water in the heat exchanger 20 is transferred to the water above in one of two ways, depending on the temperature gradient within the water volume.

For example, if the temperature of the water in the system is substantially uniform at approximately 4° C., the increase in temperature of the water in the heat exchanger 20 decreases its density relative to the water above. A convection current is thus re-established whereby the warmer and therefore less dense water in the heat exchanger 20 is displaced by the cooler water above. The warmer water rises towards the reservoir 12 where it is cooled again by the cooling elements 14 and then sinks back down into the heat exchanger 20. Thus, heat is transferred from the heat exchanger 20 to the reservoir 12 primarily by convection.

Whilst power from the external power supply 16 is supplied to the cooling elements 14 and the fan or compressor 26, therefore, this recirculation within the water volume defined by the reservoir 12 and heat exchanger 20 may continue indefinitely, advantageously maintaining the battery 40 at a lower than ambient temperature and thereby prolonging its usable life.

On the other hand, if the temperature of the water in the reservoir 12 is significantly lower than that of the water in the heat exchanger 20, for example at or below freezing, the density of the water in the heat exchanger may remain greater than that of the water in the reservoir 12, despite the increase in temperature. Thus the water in the heat exchanger 20 tends to remain in the heat exchanger 20 and no circulation of water is established. In this case, heat absorbed by the water in the heat exchanger 20 is transferred to the colder water in the reservoir 12 primarily by conduction, the rate of which depends on the temperature differential between the heat exchanger 20 and the reservoir 12.

In some embodiments, heat absorbed by the water in the heat exchanger 20 is transferred to the colder water in the reservoir 12 primarily by conduction. The rate of heat transfer may depend on the temperature differential between the fluid in the heat exchanger 20 and fluid in the reservoir 12.

Again, whilst power from the external power supply 16 is supplied to the cooling elements 14 and the fan or compressor 26, a relatively large negative temperature differential is maintained between the water in the heat exchanger 20 and the water in the reservoir 12. Thus, heat transfer from the heat exchanger may continue indefinitely, advantageously maintaining the battery 40 at a lower than ambient temperature and thereby prolonging its usable life.

Even in the event that the power from the external power supply 16 fails, for example during a rolling blackout or following an unexpected event, such that power is no longer supplied to the cooling elements 14, the apparatus 10 is able to provide a temporary cooling effect on the battery 40, as described below.

Due to the high specific heat capacity of water, the volume of water in the apparatus 10 is able to absorb a large amount of heat from the ambient air flowing across it without a significant increase in temperature. By way of example, a system containing 1000 liters of water at an average of 4° C. would require absorption of approximately 130 MJ of heat from the air flowing across it before its temperature reached 35° C. Where the temperature of the water in the reservoir 12 was lower than 4° C. at the point that power to the cooling elements 14 was cut, the amount of energy able to be absorbed would increase. In the case of apparatus employing a phase change fluid such as water which freezes in the region of the cooling element 14, it may take several hours for the frozen fluid to melt, during which period cooling of fluid in the reservoir 12 continues. Due to the high specific heat capacity of water, the volume of water in the apparatus 10 is able to absorb a large amount of heat from the ambient air flowing through the heat exchanger 20 without a significant increase in temperature.

The rate at which the heat absorbed by the water in the heat exchanger is transferred through the water volume after electrical power is cut depends on the thermal gradient between the reservoir 12 and the heat exchanger 20. Assuming that much of the water in the reservoir 12 is in the form of ice, there will be a large negative temperature differential between the heat exchanger 20 and the reservoir 12 such that heat is conducted away from the water in the heat exchanger 20 and absorbed by the ice in the reservoir 12.

Since a relatively large amount of energy is required to melt ice within the reservoir 12, known as the latent heat of fusion, it acts as a sink for the energy that is absorbed by the water in the heat exchanger 20. While the temperature of the water in the reservoir 12 is less than 4° C., its density remains lower than that of the water contained in the heat exchanger 20 and therefore does not sink. Thus, the water contained in the heat exchanger tends to remain at a temperature of around 4° C., thereby maintaining the cooling effect on the battery 40.

Eventually, the temperature of the water in the reservoir 12 reaches approximately 4° C. At this point, any increase in temperature of the water in the heat exchanger 20 reduces its density below that of the water above and the above-described convection current may be re-established whereby heat is transferred away from the water in the heat exchanger 20 primarily by convection.

As long as the average temperature of the water in the system remains below ambient temperature, heat continues to be absorbed from the air flowing across the heat exchanger 20, thereby cooling the air directed towards the battery 40. During this time, therefore, the cooling effect on the battery 40 is maintained although, it will be appreciated, to a lesser degree than when power is supplied to the cooling elements 14.

Even once the temperature of the water in the apparatus 10 reaches ambient, the jets of ambient temperature air directed towards the battery 40 assist the transfer of heat away from the battery 40 which, during use, operates at a significantly higher than ambient temperature.

It will be appreciated that embodiments of the present invention provide a simple yet effective method and apparatus for cooling one or more articles such as one or more batteries. During periods in which mains or other external electrical power is available, embodiments of the invention may cool the batteries significantly below ambient temperature, thereby maintaining their usable life. Following loss of external electrical power, embodiments of the invention are able to maintain a reasonable cooling effect on the batteries so as to reduce their rate of temperature increase and thus at least partially mitigate the adverse effect of temperature on the batteries' useable life.

The applicants have determined that the apparatus of the present invention may provide a cooling effect on the battery 40 for several hours following loss of electrical power to the cooling elements 14, although it will be understood that the precise length of time for which this cooling effect is maintained will depend on a number of parameters such as the ambient temperature, the volume of water in the water jacket 12, and the volume and temperature of water/ice in the reservoir 16 when electrical power was cut.

It will be appreciated that the present invention provides a simple yet effective method and apparatus for cooling one or more batteries. During periods in which mains or other external electrical power is available, embodiments of the invention may cool the batteries significantly below ambient temperature, thereby maintaining their usable life. Following loss of external electrical power, embodiments of the invention are able to maintain a cooling effect on the batteries so as to reduce their rate of temperature increase and thus at least partially mitigate the adverse effect of temperature on the batteries' useable life.

Embodiments of the invention effect a relatively slow and/or gentle heat transfer process primarily by thermal conduction through the fluid but which, at start up of the system, may be effected more rapidly so as to get the heat exchanger to working temperature more quickly, by means of thermally-induced convection currents within the fluid volume.

The above described embodiment represents one advantageous form of the invention but is provided by way of example only and is not intended to be limiting. In this respect, it is envisaged that various modifications and/or improvements may be made to the invention within the scope of the appended claims.

Figure 4:
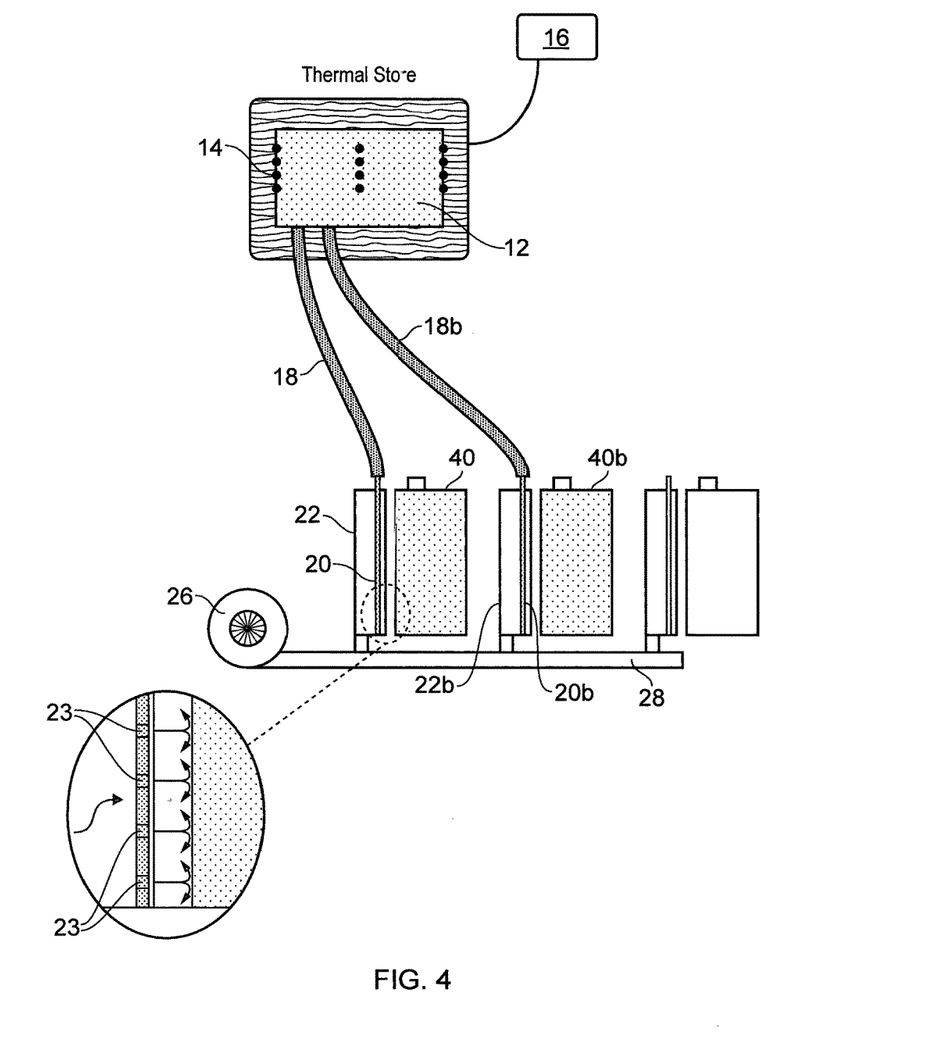
FIG. 4 is a schematic illustration of an apparatus embodying a second form of the invention.

For example, while the apparatus 10 of FIG. 2 is shown cooling a single battery, the apparatus may equally be used to cool a plurality of batteries, as shown in FIG. 4. In this embodiment, a second housing 22b and heat exchanger 20b are provided adjacent the second battery 40b and the ducting 28 is extended so as to communicate therewith. Likewise, a second fluid conduit 18b is provided between the reservoir 12 and the second heat exchanger 20b. Where further batteries are to be cooled by the apparatus 10, these features are duplicated as necessary. It will be appreciated that as the number of batteries to be cooled increases, it may be necessary to increase the size of the reservoir so as to increase the thermal capacity of the system.

In an embodiment, the or each heat exchanger 20 may communicate with the reservoir 12 by dual fluid conduits 18 so as to facilitate recirculation of water within the system. Each fluid conduit 18 in the pair may open into the respective heat exchanger 20 at spaced apart locations, for example at opposite ends thereof in the manner of a conventional convection radiator. In some such arrangements, fluid may rise and sink in each of the conduits 18, rather than flowing in the manner of a convection current wherein fluid sinks in one conduit and rises in another, causing circulation of fluid.

Figure 5:
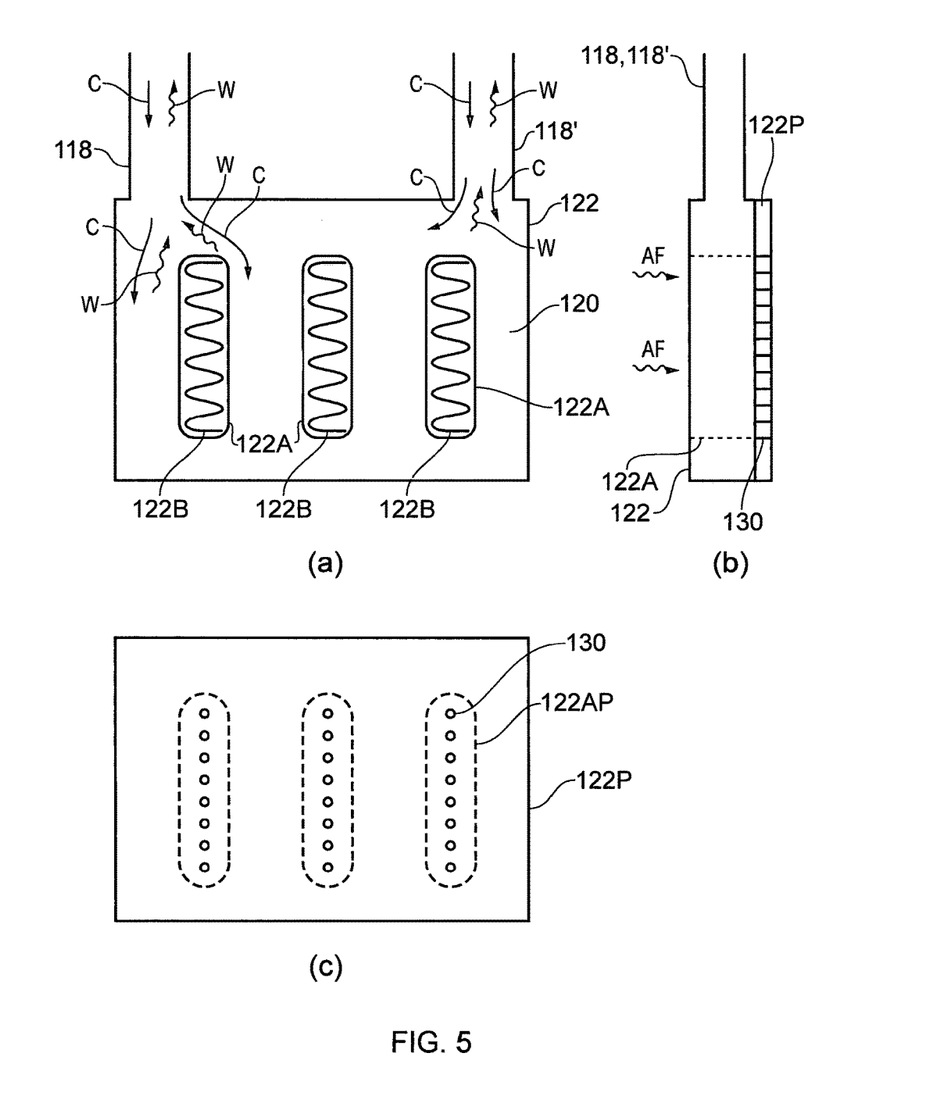
FIG. 5 is a schematic illustration of a portion of an apparatus according to an embodiment of the invention.

FIG. 5(a) shows a portion of an embodiment of the invention in which a heat exchanger 120 is provided in the form of a fluid container having three elongate apertures 122A formed therethrough across a portion of a height of the heat exchanger 120 to allow flow of cooling air or other gas through the heat exchanger 120. This increases a surface area of fluid in the heat exchanger 120 that is in contact with walls of the heat exchanger 120. The apertures 122A each have a heat conductive foil 122B of serpentine form running from one end of the aperture 122A to the other and alternately traversing a width of an aperture 122A. The foil 122B is therefore in thermal contact with a wall of the heat exchanger 120 defining the aperture 122A at multiple locations along the aperture 122A, enhancing conduction of thermal energy away from fluid in contact therewith.

The heat exchanger 120 is coupled to a pair of fluid conduits 118, 118' that connect the heat exchanger 120 to a reservoir such as the reservoir 12 of the embodiment of FIG. 4. It is to be understood that the conduits 18, 18b illustrated in the embodiment of FIG. 4 could be connected to the housing 122 instead of the heat exchangers 20, 20b of FIG. 4.

In use, fluid in the form of liquid cooled in the reservoir 12 to which the heat exchanger 120 is attached sinks through the conduits 118, 118' (arrows C of FIG. 5(a)) and enters the heat exchanger 120 where cooling of the foils 122B and therefore of air flowing through the apertures 122A takes place. Fluid warmed by conduction of heat through the walls of the heat exchanger 12 rises through the conduits 118, 118' to the reservoir 12, as indicated by arrows W of FIG. 5(a). It is to be understood that the specific direction and manner of fluid flow may depend on a number of factors including the internal shape of the heat exchanger 120 and the locations of the conduits 118. 118'. It is expected that a substantially static equilibrium will eventually become established in which fluid in the reservoir 12 and/or heat exchanger 120 may become substantially static.

FIG. 5(b) shows the heat exchanger 120 in side view with an aperture plate 122P installed on one face of the heat exchanger 120 as described in more detail below.

In use, air is blown through the apertures 122A by a fan such as fan 26, causing cooling of the foils 122B. The direction of air flow is labelled AF in FIG. 5(b).

In the embodiment shown an aperture plate 122P is provided as part of the housing 122 on a downstream side of the housing 122 with respect to the flow of air through the apertures 122A. The aperture plate 122P is illustrated in front view in FIG. 5(c) and has three rows of apertures 130 formed therein, the apertures 130 being aligned with a longitudinal axis of a projection of each aperture 122A of the heat exchanger 120 onto the plate 122P in a direction parallel to that of airflow through the apertures 122A. A projection of the apertures 122A onto the plate 122P is shown in dotted outline at 122AP in FIG. 5(c) for ease of understanding. The apertures 130 formed in the plate 122P are of smaller cross-sectional area than the apertures 122A formed through the housing 122. The apertures may have the effect of increasing a residence time of air in contact with the walls of the apertures 122A as the air passes through the apertures 122A. Fine jets of air that have passed through apertures 122A in the housing emanate from the apertures 130 in the aperture plate 122P and are directed towards a battery or other article to be cooled. In some embodiments the aperture plate 122P is not employed.

The number and size of the apertures 30 in the housing can be selected as desired. It is, however, considered that the provision of a plurality of small diameter holes producing an array of fine air jets may assist penetration of the boundary layer of air on the surface of the battery 40 and thus facilitate heat transfer away from the battery. However, the location of the or each heat exchanger in a housing 22 is itself not essential and the heat exchanger 20 may simply be positioned close to or adjacent the battery 40, or may be mounted directly thereto.

It is also envisaged that where the heat exchanger 20 is mounted in physical contact with the battery 40, this may provide a sufficient cooling effect without the need for a flow of air therethrough. In this case, the fan 26, ducting 28 and housing 22 can be eliminated from the system.

Where a fan or compressor 26 is provided, this may be a low power device arranged to be supplied with power from the external power supply 16 or, if the external power supply 16 fails, from the battery 40 itself. The use of photovoltaic cells to supply power to the fan or compressor 26 is considered particularly advantageous.

Likewise, the cooling elements 14 may be supplied with power from photovoltaic cells. In such an arrangement, loss of electrical power due to a reduction in available solar energy generally coincides with periods of darkness or poor weather conditions when the ambient temperature is lower and thus the requirement to cool the batteries is reduced.

It is to be understood that it is not essential that the reservoir 12 and the heat exchanger 20 form a single, continuous volume. In one embodiment, a heat exchanger 20 may be provided for exchanging heat between fluid in the reservoir 12 and fluid in the conduit 18. Thus at least two separate fluid bodies may be provided, one comprising fluid in the reservoir 12 and one comprising fluid in the conduit 18 and heat exchanger 20. Other arrangements are also useful. For example in addition or instead fluid in the conduit 18 may be in fluid isolation from but in thermal communication with fluid in the heat exchanger 20.

It is to be understood that the temperature at which the water in the system has the highest density may be varied by means of an additive, such as a salt. For example the addition of a salt such as sodium chloride or potassium chloride may lower the temperature at which water is of its highest density. Other fluids that exhibit a negative thermal expansion coefficient (i.e. a decrease in density with decreasing temperature) below a certain temperature and a positive thermal expansion coefficient above that temperature may also be useful.

While the function of the apparatus relies on the reservoir 12 being disposed above the heat exchanger 20, it is not essential that the reservoir 12 be vertically aligned and it can be positioned generally as desired according to the application and any packaging restrictions.

It is envisaged that the electrical cooling element may be replaced with a cold thermal mass such as an amount of water ice or dry ice placed in the reservoir. The cold thermal mass may be of any suitable fluid, preferably a frozen fluid such as water. The cold thermal mass may be in the form of a fluid container containing a frozen fluid, such as an ice pack. In some embodiments the cold thermal mass may be provided in a compartment that is in thermal communication with the fluid in the reservoir. The compartment may have a door or lid that can be opened or removed to allow introduction of the thermal mass. Other arrangements are also useful.

It is not essential that the reservoir and the heat exchanger form a single, continuous volume. Where a thermal mass is provided as the cooling means, it is envisaged that the reservoir may be separated from a discrete circuit of mostly water so as to effect heat transfer, i.e. two separate fluid bodies are provided.

The reservoir may alternatively, or in addition, be cooled by means of absorption refrigeration wherein solar energy directly produces a cooling effect in proportion to the amount of energy and thus in proportion to the heating effect of the sunlight.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. An apparatus for cooling an article comprising:
a heat exchanger, the heat exchanger including a container configured to contain a fluid, the container having an exterior heat exchange surface, the heat exchanger configured to, while in use, cool the article;
a reservoir configured to contain the fluid, the reservoir disposed substantially above the heat exchanger and coupled to the heat exchanger such that, while in use, the fluid is allowed to flow between the reservoir and the container of the heat exchanger, wherein the heat exchanger is configured to be positioned separately from the reservoir via a conduit;
a cooling element for, while in use, cooling the fluid within the reservoir; and
a sensor disposed within the reservoir and configured to detect the formation of frozen fluid in the reservoir and wherein an output of the sensor is used to interrupt the operation of the cooling element upon detection of the formation of frozen fluid;

wherein, the fluid has a positive temperature coefficient of thermal expansion above a critical temperature thereof and a negative temperature coefficient of thermal expansion below the critical temperature thereof, the critical temperature being a temperature above a freezing point of the fluid.

2. The apparatus according to claim 1, wherein the cooling element comprises at least one of:
a low temperature thermal mass; or
at least one electrical or fuel powered cooling element.

3. The apparatus of claim 1, wherein at least one of the sensor is disposed between the cooling element and the heat exchanger.

4. The apparatus of claim 1 wherein the cooling element is configured to cool the fluid to a temperature at or below the critical temperature.

5. The apparatus of claim 1, wherein the cooling element is electrical and is supplied with electrical power by any of:
a mains power supply;
a solar power supply; or
a battery.

6. The apparatus of claim 1, wherein the article to be cooled is a battery.

7. The apparatus of claim 1, wherein the reservoir and heat exchanger are in fluid communication by way of the conduit.

8. The apparatus of claim 1, further comprising:
air flow means for passing air over or through the heat exchanger towards, onto or around the article;
wherein, while in use, air passed over or through the heat exchanger is cooled via contact with the heat exchanger surface and directed towards the article.

9. The apparatus of claim 8, wherein the air flow means include a fan or compressor in fluid communication with the heat exchanger via a ducting.

10. The apparatus of claim 9, wherein the heat exchanger is disposed within a housing in fluid communication with the ducting, the housing comprising an aperture therein through which air passing over or through the heat exchanger is expelled from the housing towards, onto or around the article.

11. The apparatus of claim 1, wherein the heat exchange surface comprise a plurality of apertures arranged to permit air to pass through the heat exchanger.

12. The apparatus of claim 1, wherein the heat exchanger is formed from a thermally transmissive material.

13. The apparatus of claim 1, wherein the fluid is water.

14. The apparatus of claim 1, wherein the cooling element includes at least one cooling element powered by an electrical power supply, and wherein the apparatus is arranged to provide a cooling effect on the article for a predetermined period of time following interruption of the power supply to the at least one cooling element.

15. The apparatus of claim 1, wherein the reservoir is thermally insulated.

16. The apparatus of claim 1, being arranged such that, in use, the temperature of the fluid within the reservoir is at a temperature below a target temperature of the fluid within the heat exchanger.

17. The apparatus of claim 1, wherein the heat exchanger is located adjacent the article to be cooled.

18. The apparatus of claim 1, wherein the heat exchanger is located in thermal contact with the article to be cooled.

19. A method for cooling an article, the method comprising:
cooling fluid stored in a reservoir disposed substantially above a heat exchanger using a cooling element disposed within the reservoir;
permitting higher density fluid to sink from the reservoir into the heat exchanger so as to cool an exterior heat exchange surface of the heat exchanger and absorb heat from the article, wherein the exterior heat exchange surface is configured so as to be positioned separately from the reservoir via a conduit;
wherein the fluid has a positive temperature coefficient of thermal expansion above a critical temperature thereof and a negative temperature coefficient of thermal expansion below the critical temperature thereof, the critical temperature being a temperature above a freezing point of the fluid; and
transferring heat from fluid in the heat exchanger to fluid in the reservoir so as to maintain the temperature of the heat exchanger at or around a target temperature.

20. The method of claim 19, wherein the target temperature is approximately 4° C.

21. The method of claim 19, further comprising
flowing air across or through the heat exchanger using air flow means, such that heat is absorbed therefrom and directing said cooled air towards, onto or around the article;
wherein the air flow means include a fan or compressor.

22. The method of claim 19, wherein the fluid is substantially comprised of water.

23. The method of claim 19, wherein the reservoir is thermally insulated.

24. An apparatus for cooling a battery comprising:
a heat exchanger that includes a container configured to contain a fluid, the container having a heat exchange surface, the heat exchanger configured to, while in use, cool the battery;
a reservoir configured to contain the fluid, the reservoir disposed substantially above the heat exchanger and coupled to the heat exchanger such that, while in use, the fluid is allowed to flow between the reservoir and the container of the heat exchanger; and
a cooling element for, while in use, cooling the fluid within the reservoir, the cooling element configured to be powered by the battery;
wherein, the fluid is a fluid having a positive temperature coefficient of thermal expansion above a critical temperature thereof and a negative temperature coefficient of thermal expansion below the critical temperature thereof, the critical temperature being a temperature above a freezing point of the fluid.

25. The apparatus of claim 24, further comprising:
a sensor disposed within the reservoir and configured to detect the formation of frozen fluid in the reservoir and interrupt the operation of the cooling element upon detection of the formation of frozen fluid.

26. The apparatus of claim 24, further comprising:
air flow means for passing air over or through the heat exchanger towards, onto or around the article;
wherein, while in use, air passed over or through the heat exchanger is cooled via contact with the heat exchanger surface and directed towards the article.

27. The apparatus of claim 26, wherein the air flow means include a fan or compressor in fluid communication with the heat exchanger via a ducting.

28. The apparatus of claim 27, wherein the heat exchanger is disposed within a housing in fluid communication with the ducting, the housing comprising an aperture therein through which air passing over or through the heat exchanger is expelled from the housing towards, onto or around the article.

29. The apparatus of claim 24, wherein the heat exchange surface comprise a plurality of apertures arranged to permit air to pass through the heat exchanger.

* * * * *